(12) United States Patent
Costello et al.

(10) Patent No.: US 7,733,652 B2
(45) Date of Patent: Jun. 8, 2010

(54) HEAT SINK ASSEMBLY FOR A PLUGGABLE MODULE

(75) Inventors: Brian Patrick Costello, Scotts Valley, CA (US); Jordan Marshall Cole, San Jose, CA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 12/212,305

(22) Filed: Sep. 17, 2008

(65) Prior Publication Data

US 2010/0067196 A1 Mar. 18, 2010

(51) Int. Cl.
*H05K 7/20* (2006.01)
*F28F 7/00* (2006.01)
*H01L 23/34* (2006.01)

(52) U.S. Cl. .................. 361/704; 165/185; 257/719; 361/710; 361/715; 361/716; 361/719

(58) Field of Classification Search .................. None
See application file for complete search history.

(56) References Cited

U.S. PATENT DOCUMENTS

| | | | |
|---|---|---|---|
| 4,825,337 A * | 4/1989 | Karpman | 361/716 |
| 5,161,087 A | 11/1992 | Frankeny et al. | |
| 5,640,302 A * | 6/1997 | Kikinis | 361/679.41 |
| 6,086,387 A * | 7/2000 | Gallagher et al. | 439/71 |
| 6,205,023 B1 * | 3/2001 | Moribe et al. | 361/704 |
| 6,816,376 B2 | 11/2004 | Bright et al. | |
| 6,817,886 B2 * | 11/2004 | Amorim | 439/377 |
| 6,942,506 B2 * | 9/2005 | Kimura et al. | 439/159 |
| 7,001,217 B2 * | 2/2006 | Bright et al. | 439/607.2 |
| 7,036,574 B2 | 5/2006 | Thompson et al. | |
| 7,090,519 B2 * | 8/2006 | Muramatsu et al. | 439/159 |
| 7,133,285 B2 * | 11/2006 | Nishimura | 361/715 |
| 7,355,857 B2 * | 4/2008 | Pirillis et al. | 361/715 |
| 7,518,870 B2 * | 4/2009 | Choi et al. | 361/702 |
| 2003/0171016 A1 * | 9/2003 | Bright et al. | 439/160 |
| 2005/0162834 A1 * | 7/2005 | Nishimura | 361/710 |

\* cited by examiner

*Primary Examiner*—Gregory D Thompson

(57) ABSTRACT

A heat sink assembly includes a base frame and a heat sink having a module engagement surface configured to be in thermal communication with an engagement surface of a pluggable module. The heat sink assembly also includes transfer links extending between the heat sink and the base frame. The transfer links are movable to transfer the heat sink with respect to the base frame. The heat sink is movable between a recessed position and an elevated position, wherein the transfer links maintain the heat sink in a predetermined orientation with respect to the engagement surface of the pluggable module as the heat sink is transferred, between the recessed position and the elevated position.

20 Claims, 7 Drawing Sheets

HEAT SINK ASSEMBLY FOR A PLUGGABLE MODULE

BACKGROUND OF THE INVENTION

The subject matter herein relates generally to heat sink assemblies, and more particularly, to liftable heat sink assemblies for pluggable modules.

Various types of fiber-optic and copper based pluggable modules or transceivers that permit communication between electronic host equipment and external devices are known. These pluggable modules may be incorporated into connector assemblies that can be pluggably connected to the host equipment to provide flexibility in system configuration. The pluggable modules may be constructed according to various standards for size and compatibility. The pluggable modules are plugged into a receptacle that is mounted on a circuit board within the host equipment. The receptacle typically includes an elongated guide frame having a front that is open to an interior space, and an electrical connector disposed at the rear of the receptacle within the interior space for mating with the pluggable module.

Due to increases in the density, power output levels and/or switching speeds of fiber-optic and/or copper based pluggable modules or transceivers, there is a corresponding increase in the heat generated by such devices. The heat generated by the operation of these devices can lead to significant problems as some of the devices may be destroyed if the core temperature is too great, or the performance of the device may be substantially degraded. Known techniques used to control the temperature of individual devices include the use of heat sinks, heat pipes and fans.

Known heat sinks, or other cooling equipment, are not without disadvantages. For instance, the types of heat sinks in use today tend to be somewhat cumbersome to assemble and manufacture. Additionally, some systems employ heat sinks which are manufactured in such a way that the heat sinks are integral with the pluggable module being cooled, and are thus difficult to handle efficiently in high-volume manufacturing environment. Heat sinks are less efficacious when used with modular electronic devices. For example, in order to facilitate maintenance and fast replacement of failed pluggable modules, the pluggable modules can be removed from, or inserted into, the receptacle. As the pluggable module is slid into and out of the receptacle, it may become problematic to maintain an efficient thermal connection between the pluggable module and the heat sink. Typically, as the pluggable module is loaded into and removed from the receptacle, the pluggable module slides along the interface of the heat sink. Some known heat sinks provide a thermal interface material at the interface of the heat sink to improve the thermal contact therebetween. Difficulties arise when the pluggable modules slide along the thermal interface material. For example, the thermal interface material may be easily damaged or destroyed by the sliding action.

A need remains for a cage assembly that may be used repeatedly without diminishing and/or damaging a thermal interface of a heat sink. A need remains for a heat sink assembly that may be disengaged from the pluggable module during insertion and removal of the pluggable module within the receptacle.

BRIEF DESCRIPTION OF THE INVENTION

In one embodiment, a heat sink assembly is provided that includes a base frame and a heat sink having a module engagement surface configured to be in thermal communication with an engagement surface of a pluggable module. The heat sink assembly also includes transfer links extending between the heat sink and the base frame. The transfer links are movable to transfer the heat sink with respect to the base frame. The heat sink is movable between a recessed position and an elevated position, wherein the transfer links maintain the heat sink in a predetermined orientation with respect to the engagement surface of the pluggable module as the heat sink is transferred between the recessed position and the elevated position.

Optionally, the heat sink may be maintained in a substantially parallel orientation as the heat sink is transferred between the recessed position and the elevated position. The heat sink may have a front, a rear and opposed sides, wherein a plurality of the transfer links are connected to at least one of the sides of the heat sink. The transfer links may be movable with respect to both the heat sink and the base frame. The heat sink may have a thermal interface material layer applied to the module engagement surface. Optionally, the base frame may be mounted above the pluggable module such that the module engagement surface is in thermal communication with the engagement surface of the pluggable module when in the recessed position. The transfer links may be rotated about the coupling between the transfer link and the base frame. The transfer links may be substantially identically formed and remain parallel with respect to one another during the transfer of the heat sink between the recessed position and the elevated, position. Optionally, each of the transfer links may have a central axis angled non-orthogonally with respect to the module engagement surface throughout the transfer of the heat sink between the recessed position in the elevated position.

Optionally, the heat sink may include sliding ramps extending beyond the module engagement surface. The sliding ramps may rest upon the engagement surface of the pluggable module when the heat sink is in the elevated position to elevate the module engagement surface above the engagement surface of the pluggable module. Optionally, the heat sink assembly may also include a spring connected between the heat sink and the base frame, where the spring forces the heat sink to the recessed position. The spring may compress in a biasing direction generally parallel to the module engagement surface, and the transfer links may be angled with respect to the spring to convert a portion of the biasing force of the spring in a direction generally perpendicular to the module engagement surface in a direction generally towards the engagement surface of the pluggable module.

In another embodiment, a heat sink assembly is provided that includes a base frame and heat sink. The heat sink includes a module engagement surface configured to be in thermal communication with an engagement surface of a pluggable module. The heat sink is movable between a recessed position and an elevated position. Transfer links extend between the heat sink and the base frame, and the transfer links are movable to transfer the heat sink with respect to the base frame. The heat sink assembly also includes an actuator assembly having a button configured to be actuated by a user and a beam engaging one of the transfer links when the button is actuated. The transfer links maintain the heat sink in a predetermined orientation with respect to the engagement surface of the pluggable module as the heat sink is transferred between the recessed position and the elevated position.

In a further embodiment, a cage assembly for mating with a pluggable module having an engagement surface is provided that includes a receptacle, a heat sink assembly, and an actuator assembly. The receptacle defines an interior space that receives the pluggable module. The receptacle has an outer opening providing access to the interior space. The receptacle also has an interface connector therein for mating with the pluggable module and a guide rail therein for guiding the pluggable module within the receptacle. The guide rail has a rail body having a cavity and a beam opening open to the cavity. The heat sink assembly is provided along the outer opening of the receptacle. The heat sink assembly has a base frame, a heat sink and transfer links extending between the heat sink and the base frame. The heat sink has a module engagement surface configured to be in thermal communication with an engagement surface of the pluggable module. The transfer links are movable to transfer the heat sink between a recessed position and an elevated position. The actuator assembly is received in the cavity. The actuator assembly has a button configured to be actuated by a user and a beam extending through the beam opening to engage one oldie transfer links when the button is actuated.

DETAILED DESCRIPTION OF THE INVENTION

Figure 1:
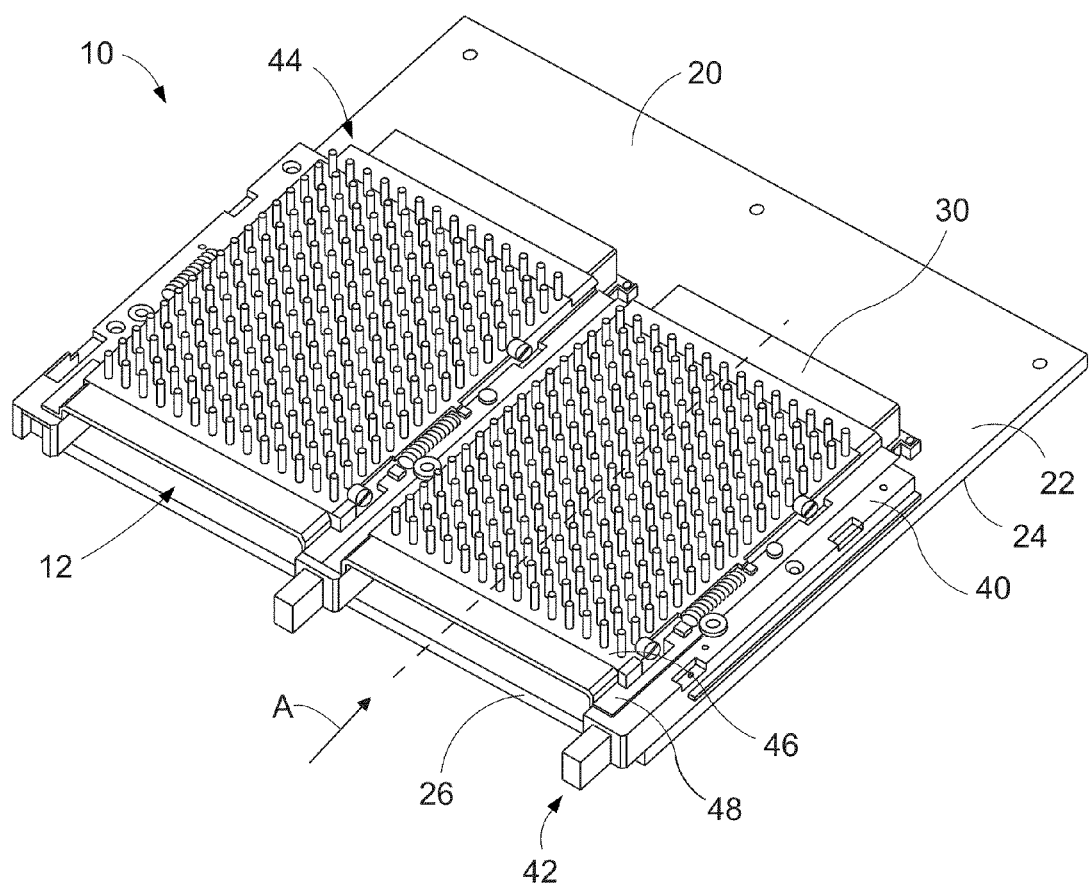
FIG. 1 illustrates a cage assembly having a plurality of receptacles that receive pluggable modules therein.

FIG. 1 illustrates a cage assembly 10 having a plurality of receptacles 12 that receive pluggable modules 14 (shown in FIG. 2) therein. In an exemplary embodiment, the cage (make same change throughout the application) assembly 10 constitutes an input/output assembly for a device such as a computer or network switch. The pluggable modules 14 may represent line cards or transceiver modules that are pluggable into the receptacles 12, but are not limited thereto. The pluggable modules 14 include ports 16 (shown in FIG. 2) for interfacing with data cables, such as communication cables. Optionally, the data cables may be copper wire data cables or alternatively may be fiber-optic data cables. The cage assembly 10 illustrated in FIG. 1 shows two receptacles 12 with one of the receptacles 12 having a pluggable module 14 therein. Any number of receptacles 12 may be provided and any number of the receptacles 12 may have pluggable modules 14 therein.

The cage assembly 10 includes a substrate 20, which is represented in the illustrated embodiment by a circuit board. The substrate 20 includes a first side 22 and a second side 24. The substrate 20 also includes a front edge 26. The receptacles 12 are illustrated as being on only one side 22 of the substrate 20, however the receptacles 12 may be provided on both sides 22, 24 in alternative embodiments. In an exemplary embodiment, the substrate 20 defines a side of each receptacle 12. Alternatively, another component may extend along the substrate 20 and define a portion of the receptacle 12. For example, a frame or housing may be supported by the substrate 20 and define the receptacle 12.

The cage assembly 10 includes a plurality of interface connectors 30 corresponding to respective receptacles 12. The interface connectors 30 may be mounted directly to the substrate 20, or alternatively may be indirectly supported by or positioned proximate to the substrate 20. In an exemplary embodiment, the interface connectors 30 are mechanically and electrically coupled to the substrate 20. Optionally, the interface connectors 30 are positioned along and/or define a back of the respective receptacles 12. The interface connectors 30 mate with the pluggable modules 14 when the pluggable modules 14 are loaded into the receptacles 12.

The cage assembly 10 includes a plurality of guide rails 40. Optionally, the guide rails 40 may be mounted directly to the substrate 20, or alternatively may be indirectly supported by or positioned proximate to the substrate 20. The guide rails 40 may be positioned on both sides 22, 24 of the substrate 20. In an exemplary embodiment, a pair of the guide rails 40 define opposite sides of each receptacle 12. The guide rails 40 operate to guide the pluggable modules 14 into the corresponding receptacles 12. For example, the pluggable modules 14 engage the guide rails 40 when the pluggable modules 14 are loaded into the receptacles 12. The guide rails 40 guide the pluggable modules 14 to the corresponding interface connectors 30 in a loading direction along a loading axis, shown generally along the arrow A.

In an exemplary embodiment, the guide rails 40 are configured to have de-actuator assemblies 42 integrated therewith and heat sink assemblies 44 mounted thereto. The heat sink assemblies 44 include a heat sink 46 and a base frame 48 for supporting the heat sink 46. The heat sinks 46 are movable with respect to the base frames 48. The de-actuator assemblies 42 are used for unlocking the pluggable modules 14 within the receptacles 12 and/or for de-actuating the heat sinks 46 between various positions with respect to the receptacles 12, as will be described in further detail below. The de-actuator assemblies 42 may be operated by a user to release the pluggable modules 14 from the receptacles 12 and/or to elevate the heat sinks 46 from the receptacles 12.

Figure 2:
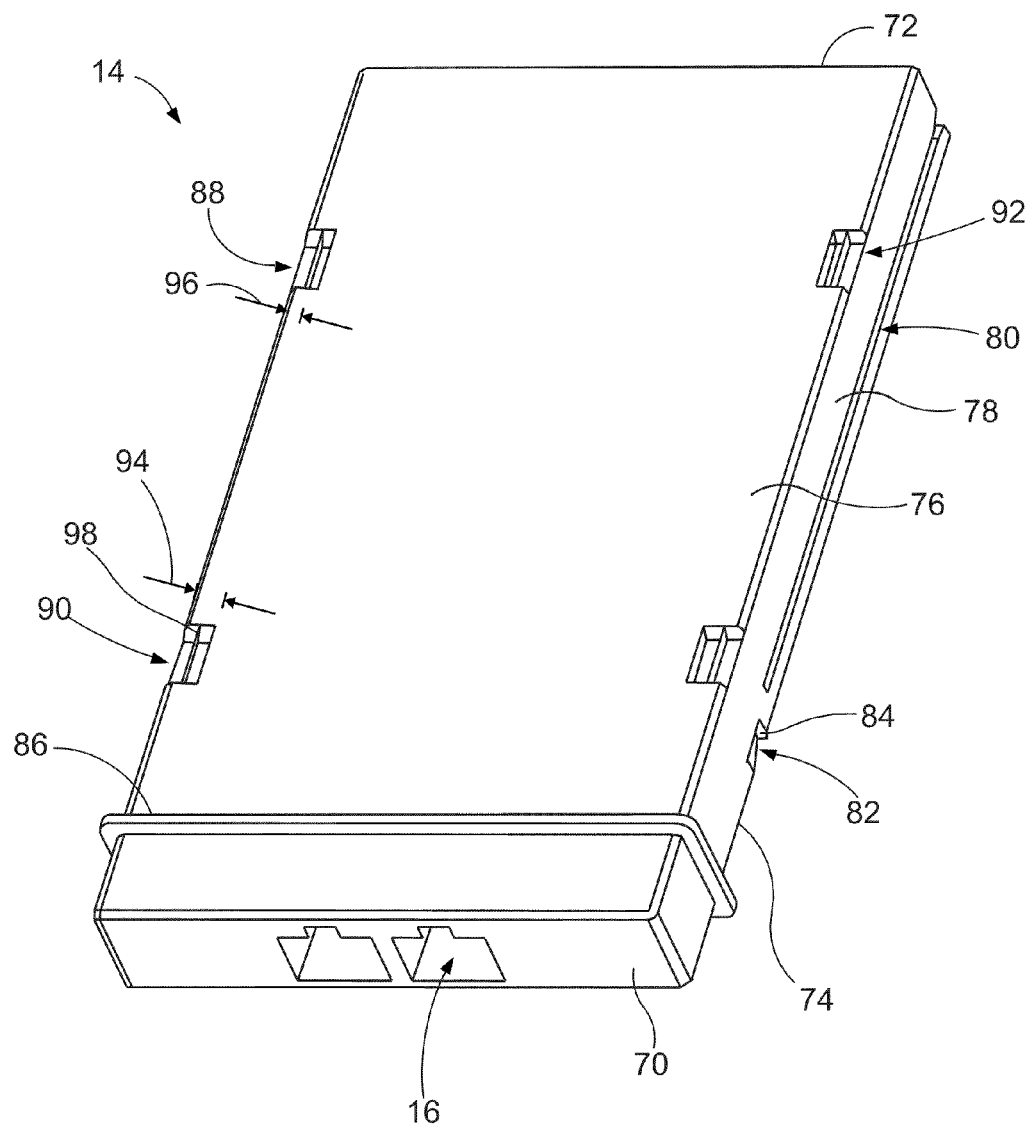
FIG. 2 is a side perspective view of one of the pluggable modules shown in FIG. 1.

FIG. 2 is a side perspective view of one of the pluggable modules 14. The pluggable module 14 has a front mating face 70 and a rear mating face 72. The rear mating face 72 is configured to be mated with the interface connectors 30 (shown in FIG. 1). The front mating face 70 has the ports 16 that receive mating plugs (not shown). The mating plugs communicate with the interface connector 30 via the pluggable module 14.

The pluggable module 14 includes an inner surface 74 and an outer surface 76 that defines an engagement surface for thermal engagement with the heat sink 46 (shown in FIG. 1). When the pluggable module 14 is loaded into the receptacle 12 (shown in FIG. 1), the inner surface 74 generally faces the substrate 20 (shown in FIG. 1) and the outer surface 76 generally faces away from the substrate 20. Side surfaces 78 extend between the inner and outer surfaces 74, 76. In the illustrated embodiment, the pluggable module 14 has a generally box-shaped body, however other shapes are possible in alternative embodiments.

Guide slots 80 may be formed in one or both of the side surfaces 78. The guide slots 80 extend from, and are open at, the rear mating face 72. Optionally, the guide slots 80 may be chamfered at the rear mating face 72. The guide slots 80 interact with the guide rails 40 (shown in FIG. 1) for guiding the pluggable module 14 within the receptacle 12.

In an exemplary embodiment, at least one of the side surfaces 78 include a latch detent 82 formed therein. The latch detent 82 includes a stop surface 84. The latch detent 82, and more particularly the stop surface 84, interacts with the actuator assembly 42 (shown in FIG. 1) for locking the pluggable module 14 within the receptacle 12.

The pluggable module 14 may include a flange 86 extending outward from at least one of the inner surface 74, the outer surface 76 and/or the side surfaces 78. When the pluggable module 14 is loaded into the receptacle 12, the flange 86 may define a stop for the loading of the pluggable module 14 into the receptacle 12. The flange 86 may position the pluggable module 14 with respect to the receptacle 12.

In an exemplary embodiment, the pluggable module 14 includes a plurality of recesses 88 formed in the outer surface 76. As will be described in further detail below, the recesses 88 are configured to receive sliding ramps of the heat sink 46. The recesses 88 may be formed in the outer surface 76 adjacent to the side surfaces 78. In alternative embodiments, the recesses 88 may be positioned remote with respect to the side surfaces 78 such as, but not limited to, near the center of the outer surface 76. In an exemplary embodiment, different types of recesses 88 are provided. In the illustrated embodiment, the pluggable module 14 includes front recesses 90 and rear recesses 92. The front recesses 90 are positioned generally closer to the front mating face 70 and the rear recesses 92 are positioned generally closer to the rear mating face 72. Optionally, the front recesses 90 may have a depth 94 measured from one of the side surfaces 78 and the rear recesses 90 may have a depth 96 measured from one of the side surfaces 78 that is narrower than the depth 94 of the front recesses 90. As will be described in further detail below, the different depths 94, 96 accommodate different sized sliding ramps of the heat sink 46. For example, a wider sliding ramp may be configured to pass over the shallower rear recess 92 as the pluggable module 14 is being loaded into, or removed from, the receptacle 12. As a result, the heat sink 46 may remain elevated above the pluggable module 14 during loading and removal of the pluggable module 14 from the receptacle 12. Optionally, the entrances and/or exits 98 of the recesses 88 may be chamfered or sloped to accommodate transitioning of the sliding ramps during insertion or removal of the pluggable module 14.

Figure 3:
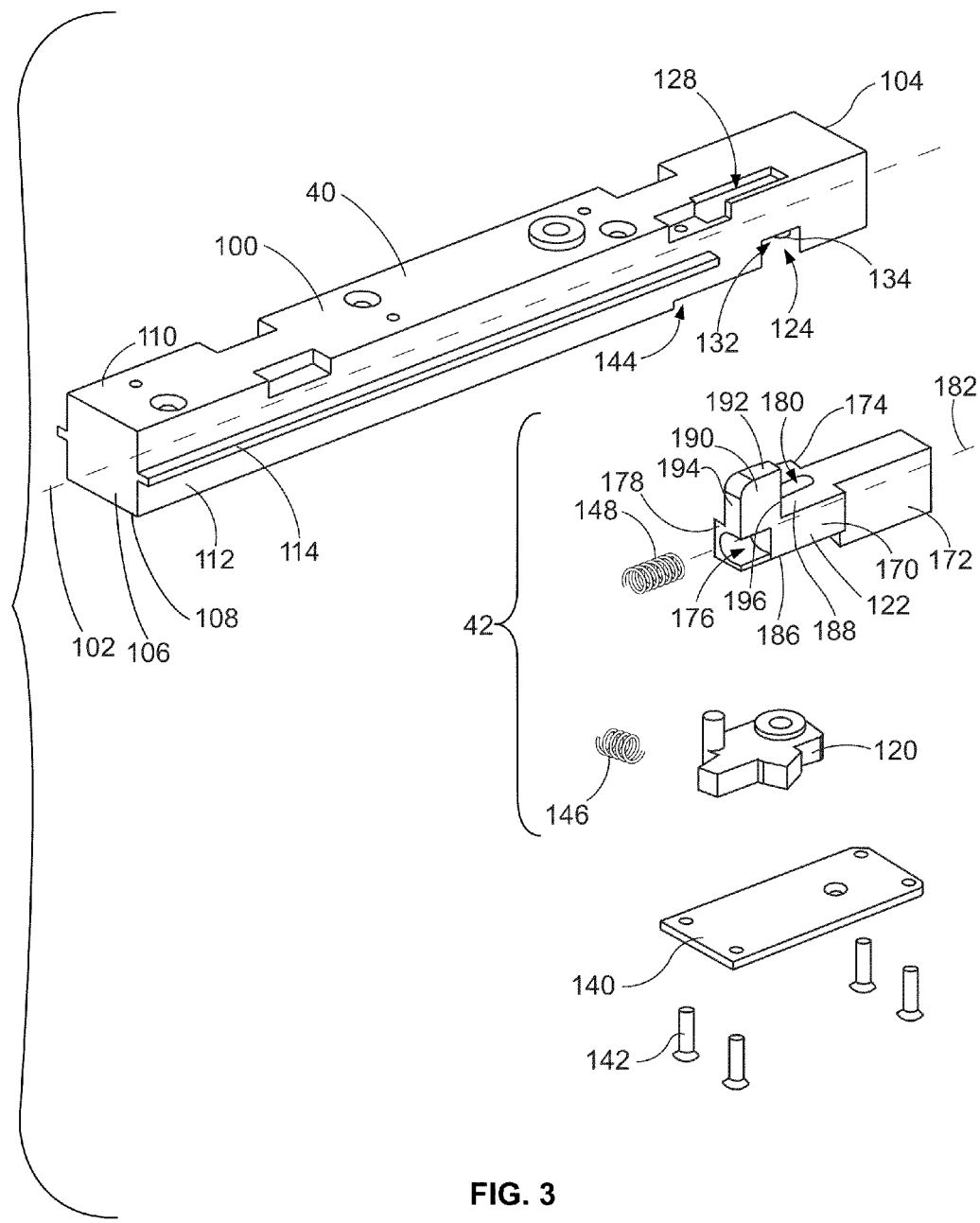
FIG. 3 is an exploded view of a guide rail and actuator assembly for the cage assembly that are formed in accordance with an exemplary embodiment.

FIG. 3 as an exploded view of one of the guide rails 40 and corresponding actuator assembly 122 that are formed in accordance with an exemplary embodiment. The guide rail 40 includes a rail body 100 extending along a rail axis 102 between a front end 104 and a back end 106. When mounted to the substrate 20 (shown in FIG. 1), the front end 104 generally faces forward and the back end 106 generally faces the interface connector 30.

The guide rail 40 includes an inner surface 108 and an outer surface 110. When mounted to the substrate 20, the inner surface 108 generally faces the substrate 20 and the outer surface 110 generally faces away from the substrate 20. Side surfaces 112 extend between the inner and outer surfaces 108, 110. In the illustrated embodiment, the rail body 100 is generally box-shaped, however other shapes are possible in alternative embodiments.

Guide rib(s) 114 may be formed on one or both of the side surfaces 112. The guide rib 114 may extend from the back end 106 generally along the rail axis 102. The guide rib 114 is positioned, sized and/or shaped to fit within a corresponding guide slot 80 of the pluggable module 14 (shown in FIG. 2).

FIG. 3 also illustrates the actuator assembly 42 at the front end 104 of the guide rail 40. The actuator assembly 42 includes a latch 120 and an actuator 122 that interacts with the latch 120. The latch 120 and the actuator 122 may have similar features, interaction, and/or operation as the latch assembly described in the co-pending patent application Ser. No. 12/211,950 titled "CONNECTOR ASSEMBLIES HAVING GUIDE RAILS WITH LATCH ASSEMBLIES", the complete subject matter and disclosure of which is hereby incorporated by reference in its entirety. In an alternative embodiment, the actuator assembly 42 may include the actuator 122 but not the latch 120.

The rail body 100 includes a side wall opening 124 and an end wall opening 126 (shown in FIG. 6) at the front end 104. The rail body 100 also includes a beam opening 128 through the outer surface 110. In the illustrated embodiment, the beam opening 128 is positioned proximate to the front end 104 near one of the side surfaces 112. The beam opening 128 may be positioned differently in alternative embodiments. The beam opening 128 is configured to have at least a portion of the actuator 122 extend therethrough in the illustrated embodiment, the side wall opening 124 is positioned proximate to the front end 104 and the inner surface 108. The side wall opening 124 may be positioned differently in alternative embodiments. The side wall opening 124 is configured to have at least a portion of the latch 120 extend therethrough. The latch 120 is configured to interact with the pluggable module 14 to lock the pluggable module 14 within the receptacle 12. Additionally, at least a portion of the actuator 122 extends through the end wall opening 126 and is exposed external to the guide rail 40. The actuator 122 is positioned such that the actuator 122 is exposed to the user for actuation.

In an exemplary embodiment, the guide rail 40 includes a cavity 132 proximate to the front end 104. The cavity 132 receives the actuator assembly 42 therein. The side wall opening 124, the end wall opening 126 in the beam opening 128 all open to the cavity 132. In an exemplary embodiment, a pin 134 extends into the cavity 132. A plate 140 is mountable to the guide rail 40 to hold the actuator assembly 42 within the guide rail 40. The plate 140 may be mounted to the rail body 100 by fasteners 142, or alternatively by different fastening means or methods. Optionally, the inner surface 108 of the rail body 100 may include a notch 144 for receiving the plate 140. As such the plate 140 may sit flush with the inner surface 108 for mounting to the substrate 20 (see shown in FIG. 1).

The actuator assembly 42 includes the latch 120 and the actuator 122. Optionally, the actuator assembly 42 may also include a latch spring 146 and an actuator spring 148. The latch spring 146 may be captured between a wall of the cavity 132 and the latch 120. Similarly, the actuator spring 148 may be captured between a wall of the cavity 132 and the actuator 122. The latch spring 146 biases against the latch 120, and the actuator spring 148 biases against the actuator 122.

The actuator 122 includes an actuator body 170 and a button 172 extending from a front 174 of the actuator body 170. Optionally, the actuator body 170 may include a spring chamber 176 at a rear 178 of the actuator body 170. The spring chamber 176 receives the actuator spring 148. The actuator body 170 includes an elongated slot 180 extending along a longitudinal axis 182 of the actuator 122. The slot 180 extends entirely through the actuator body 170 and receives the pin 134 when the actuator 122 is loaded into the cavity 132.

The actuator 122 includes an inner surface 186 and an outer surface 188. The inner surface 186 generally faces the plate 140 and the latch 120. The outer surface 188 generally faces the outer surface 110 of the rail body 100. In an exemplary embodiment, a beam 190 extends from the outer surface 188. Optionally, the beam 190 may extend perpendicularly from the outer surface 188. The beam 190 includes a distal end 192 opposite the outer surface 188. The beam 190 also includes rear and front ends 194, 196. When the actuator 122 is received in the cavity 132, the beam 190 extends through the beam opening 128 and is exposed beyond the outer surface 110 of the rail body 100. The beam 190 is movable in a direction parallel to the longitudinal axis 182 when the actuator 122 is actuated.

Figure 4:
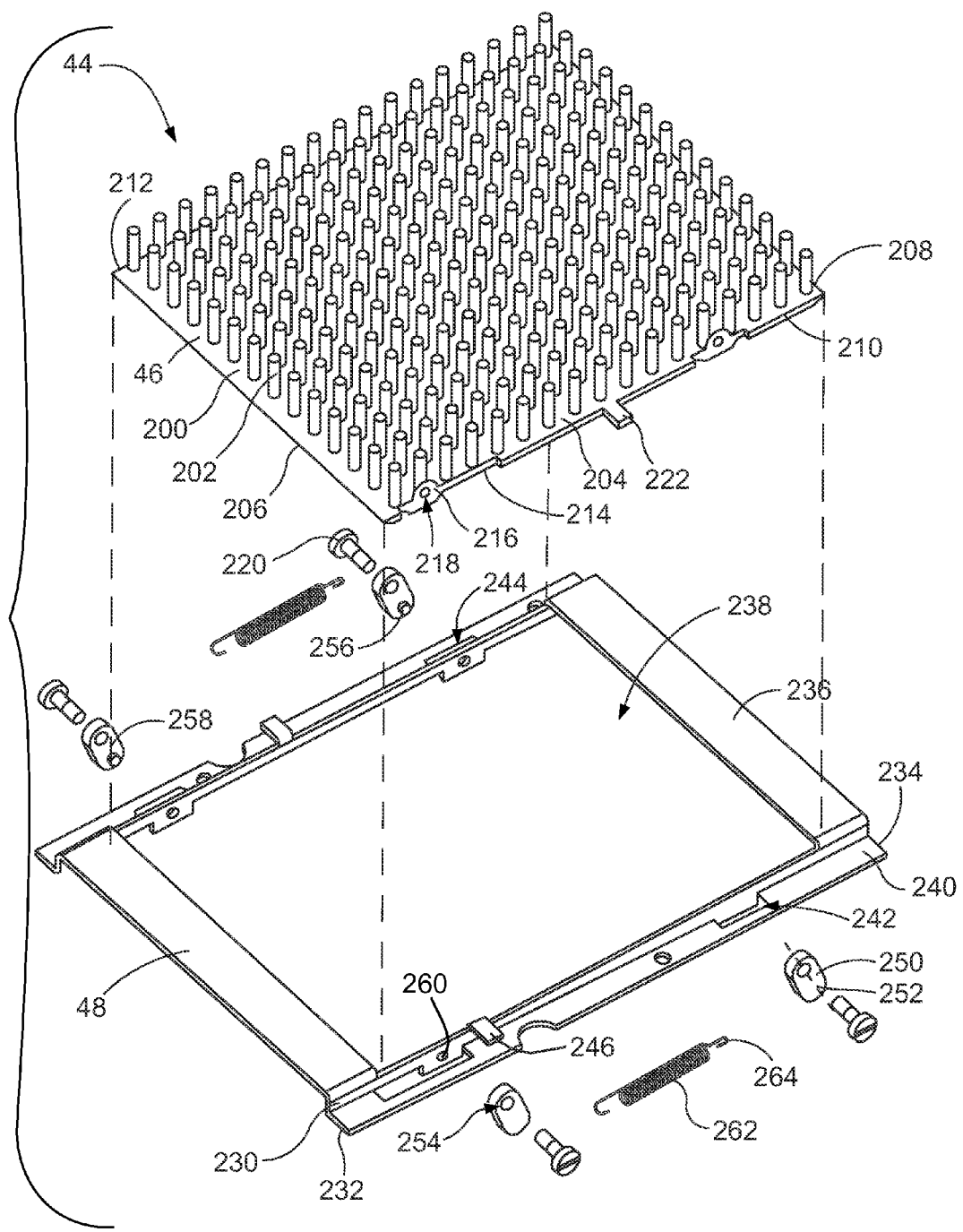
FIG. 4 is an exploded view of a heat sink assembly for the cage assembly that is formed in accordance with an exemplary embodiment.

FIG. 4 is an exploded view of one of the heat sink assemblies 44 that is formed in accordance with an exemplary embodiment. The heat sink assembly 44 includes the heat sink 46 and the base frame 48. When assembled, the heat sink 46 is movable with respect to the base frame 48, which may be securely coupled to the guide rails 40 (shown in FIG. 1) or another structure associated with the receptacle 12 (shown in FIG. 1).

The heat sink 46 includes a base 200 have a plurality of heat dissipating elements 202, such as fins, extending from a top 204 of the base 200. The base 200 also includes a front 206, a rear 208, and opposed sides 210, 212. Optionally, the front and rear 206, 208 may be sloped or slanted. The base 200 includes a bottom 214 opposite to the top 204 that represents a module engagement surface. The bottom 214 may also be referred to hereinafter as the module engagement surface 214. When the module engagement surface 214 engages the pluggable module 14 (shown in FIG. 1), the heat generated by the pluggable module 14 is dissipated by the heat sink 46.

The heat sink 46 includes a plurality of coupling elements 216 for coupling the heat sink 46 to the base frame 48. Optionally, the coupling elements 216 may include a bore 218 that receives a fastener 220 for coupling the heat sink 46 to the base frame 48. The bore 218 may be threaded. In an exemplary embodiment, the coupling elements 216 are provided along the sides 210, 212 of the base 200. Optionally, a plurality of coupling elements 216 may be provided along each of the sides 210, 212. One of the coupling elements 216 may be positioned proximate to the front 206 and another of the coupling elements 216 may be provided proximate to the rear 208. By providing the coupling elements 216 along the sides 210, 212, the array of heat dissipating elements 202 are generally unobstructed. For example, no components, such as springs or other hold down elements, are provided along the top 204 of the heat sink 46 to obstruct or block air flow along the heat dissipating elements 202. Additionally, the heat dissipating elements 202 may be evenly spaced along the top 204 without gaps or spaces that do not include heat dissipating elements 202, which may increase the effectiveness of heat dissipation of the heat sink 46.

In an exemplary embodiment, a tab 222 extends from each side 210, 212 of the base 200. Optionally, the tab 222 may be provided between the front and rear coupling elements 216. The tabs may be L-shaped to define a hook at the end or may have an opening therethrough.

The base frame 48 includes a pair of legs 230 that extend parallel to one another between a front 232 and a rear 234 of the base frame 48. Arms 236 interconnect the legs 230. Optionally, the arms 236 may be provided at the front 232 and the rear 234 leaving an opening 238 therebetween. The heat sink 46 is configured to be received in the opening 238. When the base frame 48 is mounted to the guide rails 40, or another structure associated with the receptacle 12, the opening 238 provides access to the receptacle 12 such that the heat sink 46 may engage the pluggable module 14.

The legs 230 of the base frame 48 include flanges 240 that may be mounted to the guide rails 40, or any other structure associated with the receptacle cage 12, for securing the base frame 48 in position with respect to the receptacle cage 12. In an exemplary embodiment, the flanges 240 have slots 242, 244 therethrough. The slots 242, 244 are generally aligned with the coupling elements 216. In an exemplary embodiment, each of the legs 230 has a tab 246 extending outward therefrom.

The heat sink assembly 44 includes a plurality of transfer links 250 that interconnect the heat sink 46 with the base frame 48. The transfer links 250 are movable with respect to both the heat sink 46 and the base frame 48. In an exemplary embodiment, the transfer links 250 are rotatably coupled to both the heat sink 46 and the base frame 48 allowing rotational movement of the transfer links 250 with respect to the heat sink 46 and with respect to the base frame 48. The transfer links 250 are at least partially received in one of the slots 242, 244. Optionally, each transfer link 250 may be substantially identically formed having a substantially identical shape and size. Each transfer link 250 is generally elongated along a central axis 252. Optionally, to facilitate coupling to the heat sink 46 and the base frame 48, each transfer link 250 may have an opening 254 proximate to one end of the transfer link 250 and a peg 256 extending from an inner side 258 of the transfer link 250. The opening 254 receives one of the fasteners 220 to secure the transfer link 250 to the respective coupling element 216 of the heat sink 46. The peg 256 is received in a mounting portion 260 of the respective leg 230 of the base frame 48. Optionally, the peg 256 may be cylindrical such that the transfer link 250 may be rotated about the peg 256. Other mounting components or means may be used to secure the transfer links 250 to the heat sink 46 and/or the base frame 48.

In an exemplary embodiment, the heat sink assembly 44 includes at least one heat sink spring 262. The heat sink spring 262 may be connected between the tab 222 of the heat sink 46 and the tab 246 of the base frame 48. The heat sink spring 262 may include hook ends 264 for hooking onto the tabs 222, 246. In the illustrated embodiment, the heat sink spring 262 is a coil spring, however other types of springs or biasing elements may be used rather than the coil spring illustrated in FIG. 4. Additionally, the heat sink spring 262 may be coupled to the heat sink 46 and/or the base frame 48 in a different manner rather than using the hook ends 264 and/or the tabs 222, 246. The heat sink spring 262 is generally used to position the heat sink 46 with respect to the base frame 48. In an exemplary embodiment, the heat sink spring 262 generally extends along one of the legs 230 of the base frame 48. The heat sink spring 262 may be positioned offset with respect to the heat sink 46, such that the heat sink spring 262 does not extend over any portion of the base 200. As such, the heat sink spring 262 does not interfere with the heat dissipating elements 202 and does not take up room along the top 204 of the base 200 that could otherwise be used for heat dissipating elements 202. Optionally, the heat sink spring 262 may be positioned generally vertically above, and aligned with, the flange 240.

Figure 5:
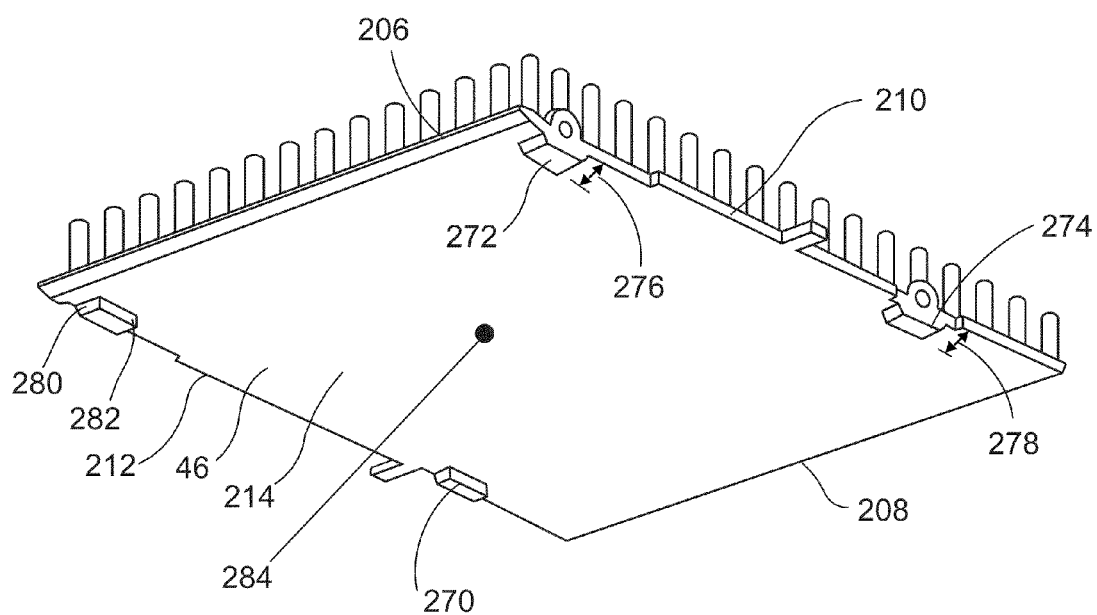
FIG. 5 is a bottom perspective view of a heat sink for the heat sink assembly.

FIG. 5 is a bottom perspective view of the heat sink 46 illustrating the module engagement surface 214 of the heat sink 46. The heat sink 46 includes a plurality of sliding ramps 270 extending beyond the module engagement surface 214. The sliding ramps 270 are configured to rest upon the outer surface 76 of the pluggable module 14 (shown in FIG. 2). The sliding ramps 270 are also configured to be received within the recesses 88 formed in the outer surface 76 of the pluggable module 14. Optionally, the sliding ramps 270 may be positioned adjacent to the sides 210, 212 of the heat sink 46. In alternative embodiments, the sliding ramps 270 may be positioned remote with respect to the sides 210, 212 such as, but not limited to, near the center of the module engagement surface 214.

In an exemplary embodiment, different types of sliding ramps 270 are provided. In the illustrated embodiment, the heat sink 46 includes front sliding ramps 272 and rear sliding ramps 274. The front sliding ramps 272 are positioned generally closer to the front 206 of the heat sink 46 and the rear sliding ramps 274 are positioned generally closer to the rear 208 of the heat sink 46. Optionally, the front sliding ramps 272 have a depth 276 measured from one of the sides 210, 212 and the rear sliding ramps 274 have a depth 278 measured from one of the sides 210, 212. The different depths 276, 278 are selected to correspond to, and allow the sliding ramps 270 to be received in, different ones of the recesses 88 of the pluggable module 14. For example, the front sliding ramps 272 may have a complementary size and/or shape to the front recesses 90 (shown in FIG. 2) while the rear sliding ramps 274 may have a complementary shape and/or size to the rear recesses 92 (shown in FIG. 2). In the illustrated embodiment, the rear sliding ramps 274 are narrower than the front sliding ramps 272. The front sliding ramps 272 are deeper than the depth 94 (shown in FIG. 2) of the rear recesses 92 such that the front sliding ramps 272 do not fall into the rear recesses 92 during loading and/or unloading of the pluggable module 14 into and out of the receptacle 10. As a result, the heat sink 46 may remain elevated above the pluggable module 14 during loading and/or removal of the pluggable module 14 into, or out of, the receptacle 12. Optionally, foreword facing surfaces 280 and/or rearward facing surfaces 282 of the sliding ramps 270 may be chamfered or sloped to accommodate transitioning of the sliding ramps 270 into and out of the recesses 88 during insertion or removal of the pluggable module 14.

In an exemplary embodiment, the module engagement surface 214 may have a thermal interface material layer 284 applied thereto. The thermal interface material layer 284 may define the module engagement surface 214. The thermal interface material layer 284 provides good thermal contact with the outer surface 76 of the pluggable module 14. The thermal interface material layer 284 may increase the thermal transfer efficiency between the pluggable module 14 and the heat sink 46. Any type of thermal interface material may be used to form the thermal interface layer 284, such as a paste, a grease, an oil, a silicone material, a phase change material, and the like.

Figure 6:
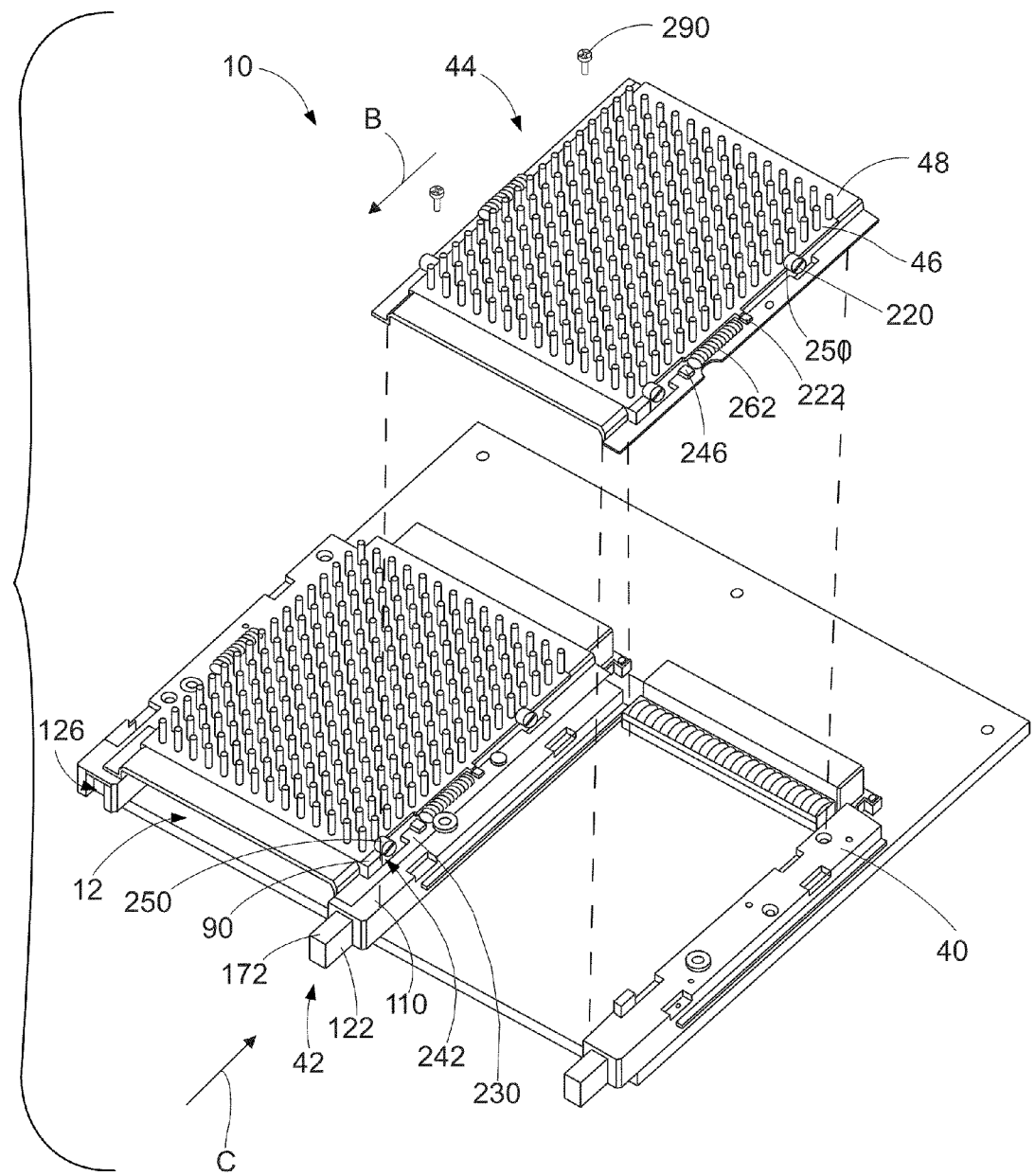
FIG. 6 is an assembly view of the heat sink assembly.

FIG. 6 is an assembly view of the cage assembly 10 illustrating the heat sink assembly 44 being mounted to the guide rails 40. The heat sink assembly 44 may be coupled to the guide rails 40 using fasteners 290. Alternative fastening means or methods may be used in alternative embodiments. In an exemplary embodiment, the heat sink 46 is coupled to the base frame 48 prior to coupling a heat sink assembly 44 to the guide rails 40. However, in an alternative embodiment, the base frame 48 may be coupled to the guide rails 40 prior to the heat sink 46 being coupled to the base frame 48.

The transfer links 250 are utilized to interconnect the heat sink 46 with the base frame 48 using the fasteners 220. FIG. 6 also illustrates the heat sink springs 262 coupled between the heat sink 46 and the base frame 48. The heat sink springs 262 extend between the tabs 222 and the tabs 246. The heat sink springs 262 generally pull the heat sink 46 in a forward direction, such as in the direction shown by arrow B. As will be described in further detail below, the transfer links 250 control the position of the heat sink 46 with respect to the base frame 48 and utilize the spring force of the heat sink springs 262 to pull the heat sink 46 downward against the pluggable module 14 (shown in FIG. 1).

In the illustrated embodiment, the beam 190 of the actuator assembly 42 extends through the outer surface 110 of the guide rail 40. When the heat sink assembly 44 is mounted to the guide rails 40, the beam 190 extends through a slot 242 in the leg 230 of the base frame 48. The beam 190 is positioned adjacent to one of the transfer links 250. When the button 172 of the actuator 122 is pressed, the actuator 122 moves rearwardly, such as in the direction of arrow C. As the actuator 122 is actuated, the beam 190 moves rearwardly and engages the transfer link 250. The beam 190 forces the transfer link 250 along a range of motion which generally lifts or elevates the heat sink 46 at least partially out of the receptacle 12. When the heat sink 46 is elevated from the receptacle 12, the pluggable module 14 (shown in FIG. 2) may be inserted into the receptacle 12, or removed from the receptacle 12, without sliding along the module engagement surface 214 (shown in FIG. 5) and/or the thermal interface material layer 284 (shown in FIG. 5). In the illustrated embodiment, due to the rotating action of the transfer links 250, the heat sink 46 is moved rearwardly in addition to being elevated. As the heat sink 46 is moved rearwardly, the heat sink springs 262 are stretched, which may increase the compressive force of the heat sink springs 262. When the button 172 is released, the heat sink springs 262 force the heat sink 46 to return to the normal or resting position, which is generally forward and downward from the position of the heat sink 46 when the button 172 is pressed.

Figure 7:
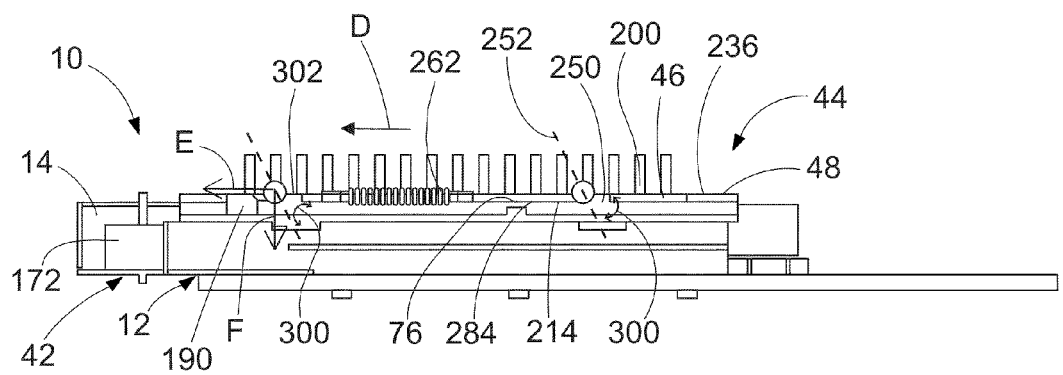
FIG. 7 is a side view of the cage assembly with the heat sink assembly in a recessed position.
Figure 8:
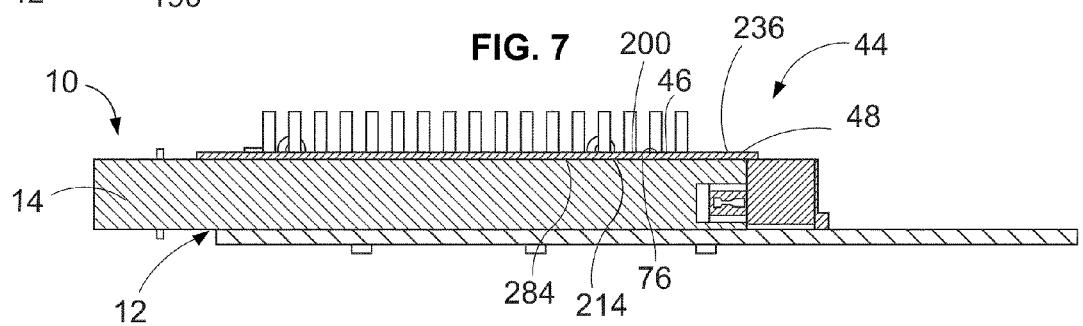
FIG. 8 is a cross-sectional view of the cage assembly with the heat sink in a recessed position.
Figure 9:
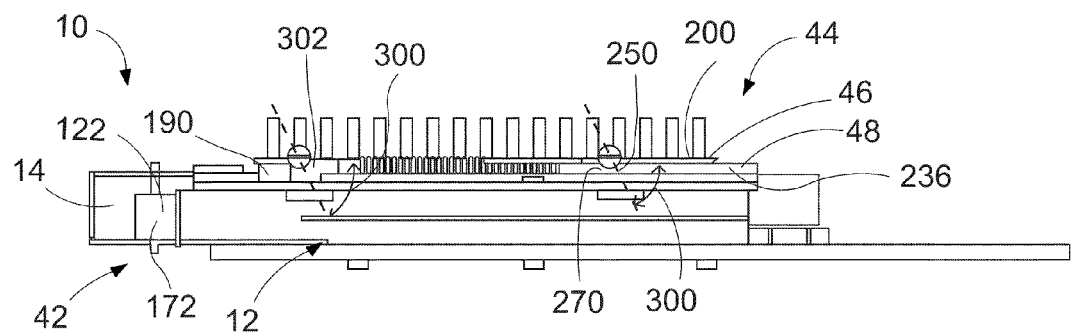
FIG. 9 is a side view of the cage assembly with the heat sink assembly in an elevated position.
Figure 10:
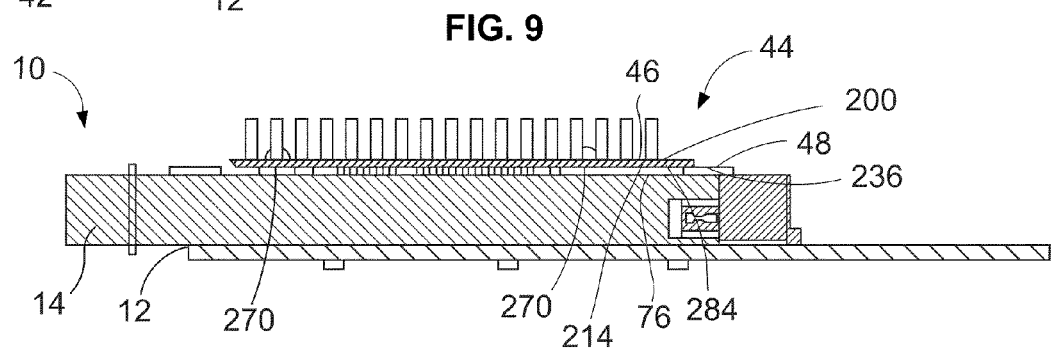
FIG. 10 is a cross-sectional view of the cage assembly with the heat sink in an elevated position.

FIG. 7 is a side view and FIG. 8' is a cross-sectional view of the cage assembly 10 with the heat sink assembly 44 in a recessed position. FIG. 9 is a side view and FIG. 10 is a cross-sectional view of the cage assembly 10 with the heat sink assembly 44 in an elevated position. The interaction of the actuator assembly 42 and the heat sink assembly 44 will be described with reference to FIGS. 7-10.

As illustrated FIGS. 7 and 8, in the recessed position, the heat sink 46 is in thermal engagement with the pluggable module 14. Heat generated by the pluggable module 14 is dissipated by the heat sink 46. The module engagement surface 214 engages the outer surface 76 of the pluggable module 14. In embodiments where the thermal interface material layer 284 is provided, the thermal interface material layer 284 engages the outer surface 76 of the pluggable module 14. The base 200 of the heat sink 46 is generally coplanar with the arms 236 of the base frame 48.

As illustrated in FIG. 7, in the recessed, position, the transfer links 250 hold the heat sink 46 against the pluggable module 14. The transfer links 250 are angled with respect to the heat sink 46 and/or the base frame 48. For example, the central axes 252 of the transfer links 250 are angled non-orthogonally with respect to the module engagement surface 214 of the heat sink 46. Optionally, the transfer links 250 may be angled at a link angle 300 of approximately 45°, however the transfer links 250 may be angled at other link angles 300. The heat sink spring 262 generally forces the heat sink 46 in the forward direction, shown in FIG. 7 by arrow D. Coupling the transfer links 250 to the base frame 48, which remain stationary with respect to the receptacle 12, generally forces the transfer links 250 to rotate along an arcuate path that rotates about the coupling point of the transfer links 250 to the base frame 48. As a result of the pulling force of the heat sink spring 262, the transfer links 250 force the heat sink 46 both forward and downward. For example, the generally horizontal spring force of the heat sink spring 262 is transformed by the transfer links 250 into both a horizontal component and a downward component by the transfer links 250. The horizontal and downward components of the force are illustrated in FIG. 7 by the arrows E and F, respectively. The link angle 300 may affect how much downward force and how much forward force is imparted onto the heat sink 46 by the transfer links 250. For example, as the link angle 300 is decreased, more downward force is achieved and less forward force is achieved. Conversely, as the link angle 300 is increased, less downward force is achieved and more forward force is achieved. The constant compression force imparted on the heat sink 46 by the heat sink spring 262 provides a constant downward force on the heat sink 46, which maintains the thermal coupling between the heat sink 46 and the pluggable module 14 when the heat sink 46 is in the recessed position.

As illustrated in FIG. 7, the heat sink assembly 44 is in the recessed position and the actuator assembly 42 is in a released position. In the released position, the button 172 is forced to a forward position. Similarly, the beam 190 is also forced to a forward position. In the forward position, the beam 190 may not engage the corresponding transfer link 250, which may be referred to hereinafter as the driving link 302. The driving link 302 is the transfer link 250 that is engaged by the beam 190 when the actuator assembly 42 is actuated. Optionally, more than one of the transfer links 250 may represent driving links 302. The beam 190 is positioned forward of the driving link 302. The driving link 302 is angled towards the beam 190 from the attachment point of the driving link 302 with the base frame 48. The beam 190 is aligned with the driving link 302 such that when the actuator assembly 42 is actuated, the beam 190 engages and drives the driving link 302.

FIG. 9 illustrates the actuator assembly 42 in a de-actuated position, such as when the button 172 has been pressed by a user. When de-actuated, the actuator 122 moves rearwardly forcing the beam 190 rearward. As the beam 190 moves rearward, the beam 190 engages the driving link 302 and forces the driving link 302 in a rearward direction. Because the transfer links 250 rotate along an arcuate path that rotates about the coupling point of the transfer links 250 to the base frame 48, the transfer links 250 force the heat sink 46 to move both rearward and upward to the elevated position. Because a plurality of the transfer links 250 are utilized on each side 210, 212 (shown in FIG. 4), the heat sink 46 remains parallel to the outer surface 76 of the pluggable module 14. Additionally, by using transfer links 250 that are substantially identical, the transfer links 250 remain parallel to one another throughout the movement between the recessed position and the elevated position which helps to keep the heat sink 46 parallel.

As illustrated in FIGS. 9 and 10, in the elevated position, the heat sink 46 is elevated above the pluggable module 14. The module engagement surface 214 of the heat sink 46 is disengaged from, and does not contact, the outer surface 76 of the pluggable module 14. Additionally, the thermal interface material layer 284 is elevated above the pluggable module 14 such that wiping does not occur along the thermal interface material layer 284 as the pluggable module 14 is inserted into, or retracted out of, the receptacle 12. In the elevated position, the base 200 of the heat sink 46 is elevated above the arms 236 of the base frame 48. Optionally, a portion of the base 200 may be positioned above and/or engage the rear arm 236 of the base frame 48.

In an exemplary embodiment, in the elevated position, the transfer links 250 are angled with respect to the heat sink 46 and/or the base frame 48. For example, the central axes 252 of the transfer links 250 are angled non-orthogonally with respect to the module engagement surface 214 of the heat sink 46. Optionally, the link angle 300 may be approximately 70°, however the transfer links 250 may be at angled at other link angles 300.

As illustrated in FIG. 10, the sliding ramps 270 rest upon the outer surface 76 of the pluggable module 14 when the heat sink 46 is moved to the elevated position. The sliding ramps 270 help ensure that the module engagement surface 214 and/or the thermal interface material layer 284 do not contact the pluggable module 14 when heat sink 46 is in the elevated position. As such the pluggable module 14 is inserted into the receptacle 12, and removed from the receptacle 12, without contacting the module engagement surface 214 and/or the thermal interface material layer 284. The pluggable module 14 may be more easily inserted into the receptacle 12, or removed from the receptacle 12, by sliding along the sliding ramps 270 as opposed to the module engagement surface 214 and/or the thermal interface material layer 284. For example, the sliding ramps 270 have less friction then the module engagement surface 214 and/or the thermal interface material layer 284. Optionally, the transfer links 250 may elevate the heat sink 46 to a height such that even the sliding ramps 270 do not contact the pluggable module 14.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means plus-function format and are not intended to be interpreted based on 35 U.S.C. §112, sixth paragraph, unless and until such claim limitations expressly use the phrase "means for" followed by a statement of function void of further structure.

What is claimed is:

1. A heat sink assembly comprising:
   a base frame;
   a heat sink having a module engagement surface configured to be in thermal communication with an engagement surface of a pluggable module, the heat sink being movable between a recessed position and an elevated position, the heat sink having sliding ramps extending beyond the module engagement surface, the sliding ramps being configured to rest upon the engagement surface of the pluggable module when the heat sink is in the elevated position to elevate the module engagement surface above the engagement surface of the pluggable module; and
   transfer links extending between the heat sink and the base frame, the transfer links being movable to transfer the heat sink with respect to the base frame.

2. The heat sink assembly of claim 1, wherein the heat sink has a front, a rear and opposed sides, wherein a plurality of the transfer links are connected to at least one of the sides of the heat sink to position the heat sink in the predetermined orientation.

3. The heat sink assembly of claim 1, wherein the transfer links are movable with respect to both the heat sink and the base frame.

4. The heat sink assembly of claim 1, wherein the heat sink has a thermal interface material layer applied to the module engagement surface.

5. The heat sink assembly of claim 1, wherein the base frame is configured to be mounted above the pluggable module, the module engagement surface being in thermal communication with the engagement surface of the pluggable module when in the recessed position.

6. The heat sink assembly of claim 1, wherein the heat sink is maintained in a substantially parallel orientation as the heat sink is transferred between the recessed position and the elevated position.

7. The heat sink assembly of claim 1, wherein the transfer links are substantially identically formed and remain parallel with respect to one another during the transfer of the heat sink between the recessed position and the elevated position.

8. The heat sink assembly of claim 1, wherein each of the transfer links has a central axis angled non-orthogonally with respect to the module engagement surface throughout the transfer of the heat sink between the recessed position and the elevated position.

9. The heat sink assembly of claim 1, wherein the transfer links maintain the heat sink in a predetermined orientation with respect to the engagement surface of the pluggable module as the heat sink is transferred between the recessed position and the elevated position.

10. The heat sink assembly of claim 1, further comprising a spring connected between the heat sink and the base frame, the spring forcing the heat sink to the recessed position.

11. The heat sink assembly of claim 1, further comprising a spring connected between the heat sink and the base frame, the spring compresses in a biasing direction generally parallel to the module engagement surface, the transfer links being angled with respect to the spring to convert a portion of the biasing force of the spring in a direction generally perpendicular to the module engagement surface in a direction generally towards the engagement surface of the pluggable module.

12. A heat sink assembly comprising:
a base frame;
a heat sink having a module engagement surface configured to be in thermal communication with an engagement surface of a pluggable module, the heat sink being movable between a recessed position and an elevated position;
transfer links extending between the heat sink and the base frame, the transfer links being movable to transfer the heat sink with respect to the base frame; and
a spring connected between the heat sink and the base frame, the spring forcing the heat sink to the recessed position;
wherein the transfer links maintain the heat sink in a predetermined orientation with respect to the engagement surface of the pluggable module as the heat sink is transferred between the recessed position and the elevated position.

13. The heat sink assembly of claim 12, wherein the heat sink has a front, a rear and opposed sides, wherein a plurality of the transfer links are connected to at least one of the sides of the heat sink.

14. The heat sink assembly of claim 12, wherein the transfer links are substantially identically formed and remained parallel with respect to one another during the transfer of the heat sink between the recessed position and the elevated position.

15. The heat sink assembly of claim 12, further comprising an actuator assembly having a button configured to be actuated by a user, the actuator assembly having a beam engaging one of the transfer links when the button is actuated.

16. The heat sink assembly of claim 15, wherein the transfer link engaged by the beam defines a driving link, the driving link being angled towards the beam, and wherein the beam is translated towards the driving link when the button is actuated to engage and rotate the driving link.

17. The heat sink assembly of claim 15, wherein translational motion of the button and the beam of the actuator assembly is converted to rotational motion of the heat sink via the transfer links.

18. A cage assembly for mating with a pluggable module having an engagement surface, the cage assembly comprising:
a receptacle defining an interior space that receives the pluggable module, the receptacle having an outer opening providing access to the interior space, the receptacle having an interface connector therein for mating with the pluggable module, and the receptacle having a guide rail therein for guiding the pluggable module within the receptacle, the guide rail having a rail body having a cavity and the rail body having a beam opening open to the cavity;
a heat sink assembly provided along the outer opening of the receptacle, the heat sink assembly having a base frame, a heat sink and transfer links extending between the heat sink and the base frame, the heat sink having a module engagement surface configured to be in thermal communication with an engagement surface of the pluggable module, the transfer links being movable to transfer the heat sink between a recessed position and an elevated position; and
an actuator assembly received in the cavity, the actuator assembly having a button configured to be actuated by a user, and the actuator assembly having a beam extending through the beam opening and engaging one of the transfer links when the button is actuated.

19. The cage assembly of claim 18, wherein the transfer link engaged by the beam defines a driving link, the driving link being angled towards the beam, and wherein the beam is translated towards the driving link when the button is actuated to engage and rotate the driving link.

20. The cage assembly of claim 18, wherein translational motion of the button and the beam of the actuator assembly is converted to rotational motion of the heat sink via the transfer links.

* * * * *